United States Patent
Polese et al.

(10) Patent No.: US 6,462,413 B1
(45) Date of Patent: Oct. 8, 2002

(54) LDMOS TRANSISTOR HEATSINK PACKAGE ASSEMBLY AND MANUFACTURING METHOD

(75) Inventors: Frank J. Polese, San Diego; Stuart Weinshanker, La Jolla; Dana R. Graham, Poway, all of CA (US)

(73) Assignee: Polese Company, Inc., San Diego, CA (US)

( * ) Notice: Subject to any disclaimer, the term of this patent is extended or adjusted under 35 U.S.C. 154(b) by 0 days.

(21) Appl. No.: 09/620,758

(22) Filed: Jul. 21, 2000

Related U.S. Application Data

(60) Provisional application No. 60/145,491, filed on Jul. 22, 1999.

(51) Int. Cl.$^7$ ............................................. H01L 23/12
(52) U.S. Cl. ..................... 257/732; 257/728; 257/670; 257/673; 257/675
(58) Field of Search ......................... 257/728, 666, 257/584, 691, 719, 732, 670, 673, 675; 438/123

(56) References Cited

U.S. PATENT DOCUMENTS

| | | | | |
|---|---|---|---|---|
| 5,075,759 A | * | 12/1991 | Moline | 357/70 |
| 5,309,014 A | * | 5/1994 | Wilson | 257/584 |
| 5,889,319 A | * | 3/1999 | Moller et al. | 257/691 |
| 5,892,270 A | * | 4/1999 | Pan | 257/666 |
| 6,020,636 A | * | 2/2000 | Adishian | 257/728 |
| 6,072,238 A | * | 6/2000 | Viswanathan et al. | 257/719 |
| 6,261,868 B1 | * | 7/2001 | Miller et al. | 438/123 |

* cited by examiner

*Primary Examiner*—David Nelms
*Assistant Examiner*—Tu-Tu Ho
(74) *Attorney, Agent, or Firm*—Henri J. A. Charmasson; John D. Buchaca

(57) ABSTRACT

A heatsink assembly and method of fabrication and use for high power RF LDMOS transistors such as those used in mobile telephone basestation pre-antenna amplifiers wherein die attachment to the heatsink flange occurs prior to leadframe/spacer-to-flange bonding. Various bonding methods are disclosed which do not compromise the die-to-flange attachment bond. A unique leadframe/spacer/flange heatsink package is also disclosed which automatically properly orients attachment of the leadframe/spacer to the flange, and provides for a thickened spacer. A unique leadframe having contact projections also avoids later wire bonding. A unique leadframe/spacer/lid combination is disclosed which allows in one step the bonding of the leadframe to the flange, electrically contacting the die, and encapsulation.

9 Claims, 8 Drawing Sheets

LDMOS TRANSISTOR HEATSINK PACKAGE ASSEMBLY AND MANUFACTURING METHOD

This application claims the benefit of U.S. provisional application No. 60/145,491, filed Jul. 22, 1999.

FIELD OF THE INVENTION

This invention relates to powder metallurgy and the manufacture of micro-electronic packages and heat-dissipating elements thereof, and more particularly to heat-dissipating RF power transistor heatsinks and packaging.

BACKGROUND OF THE INVENTION

Radio frequency ("RF") communications rely on high power transistors to boost the power of RF signals being sent to transmitting antennae. Recently the increasing demand for high bandwidth mobile phone service has caused a need for an assortment of high frequency (about 500 MHz to 2.5 GHz), relatively high power (about 30 to 250 watt) power transistors. Banks of such devices are used for example in mobile phone base stations.

A useful model has been the solid state double diffuse metal oxide silicon ("DMOS") type transistor, which is a field effect transistor formed on a semiconductor chip or die having a source, a gate and a drain which are electrically connected to metalized pads on the die's surface which are wirebonded to a leadframe which electrically connects to other circuit devices. The die is mounted on a heatsink which is integral with the transistor package.

Prior DMOS designs such as Vertical DMOS suffered from requiring the die to be mounted upon an electrically isolating layer of relatively costly, thermally efficient ceramic material such as aluminum nitride, or more typically, beryllium oxide which is difficult to manufacture due to raw beryllium toxicity.

An effort to overcome this problem resulted in the development of a Lateral DMOS ("LDMOS") transistor which does not require such electrical isolation along its mounting surface. Indeed, electrical contact to the transistor source is now had through the mounting surface, thereby requiring that it be conductive.

Referring now to FIG. 1, there is shown a prior art heatsink assembly 1 carrying a single LDMOS die 2. Other multi-chip LDMOS package designs are also available. The assembly comprises a heat-dissipating substrate commonly referred to as a "flange" 3, a dielectric insulator commonly referred to as a sealring or spacer 4 bonded to the flange which electrically isolates the flange from a conductive lead frame formed by two separate plates 5,6 bonded atop the spacer. The thickness of the spacer is selected to carry the leadframe at the proper height in relation to the die, and can be selected to change the electrical characteristics of the package.

The source of the transistor is electrically connected to the bottom of the die 2 and when packaged is electrically accessible through the conductive gold plated heatsink flange 3 upon which it is mounted. The gate and drain are connected to pads 7,8 on an upper surface of the die and are connected through wirebonds 9 to the conductive lead frame which extends out to form the package gate and drain leads 5,6. Once these interconnections have been formed, the die is encapsulated by a plastic or ceramic lid (Not Shown) bonded to the assembly.

The flange 3 is made of heat-dissipating or otherwise thermal conductivity enhanced material which typically has a coefficient of thermal expansion ("CTE") compatible with material forming the transistor which is typically gallium arsenide ("GaAs") or silicon. For example, the flange may be formed from a sintered mixture of copper and tungsten powders whose concentrations have been selected to achieve a compatible CTE as disclosed in Polese et al., U.S. Pat. No. 5,886,407 fully incorporated herein by this reference.

The spacer 4 is typically made from a ceramic such as alumina or other electrically insulating material capable of being bonded to the flange and having a CTE compatible with the CTE of the flange material.

The heatsink assembly including flange, spacer and leadframe is fabricated prior to die attach. The leadframe is bonded to the spacer, and the spacer is bonded to the flange. Typically, both bonds are formed using high temperature Cu—Ag braze alloys, commonly known as CuSil brazing. The die 2 is then attached to the flange 3 through the central aperture 10 of the spacer using gold-silicon eutectic brazing. This type of brazing involves heating the flange to about 400° C., then typically placing the die manually under the aid of a microscope to avoid damaging the leadframe or spacer. At this temperature the thin layer of gold plating on the upper surface of the flange combines with the lower surface of the silicon die to form gold-silicon eutectic.

This type of brazing is preferred due to its low cost, high thermal conductivity, the ruggedness of the bond generated, and its uniformity across a given production run. However, it requires that the prior leadframe/spacer/flange bonds be capable of withstanding temperatures of at least about 400° C. Therefore, unfortunately, other popular low temperature bonding techniques such as soldering and adhesive bonding have been ruled out.

These techniques include soldering, and the use of various conductive adhesives. The most common solder alloys available comprise two or more of the following elements: Au, Ag, Ge, In, Pb, Sb and Sn which are applied at temperatures ranging from about 150 to 400° C. Although these techniques may result in bonds which do not enjoy the same thermal performance as CuSil brazing, their availability would afford the manufacturer greater flexibility in device design and capability.

Another problem with the above approach is that die attach is typically handled manually. This is partially due to the fact that unlike earlier bipolar transistor packaging where the die was mounted upon a ceramic substrate having recognizable patterns, the metallic heatsink flange die attach area has not such targeting features. In addition, during the attachment process, the flange/spacer/leadframe subassembly is first heated on a hot plate to about 400° C. Then, under a microscope the die is placed with a slight side-to-side or circular motion and under slight pressing to encourage the formation of a uniform bonding layer of eutectic Au—Si. Although greater automation would be possible, the presence of the relatively sensitive leadframe/spacer which can be of a greater variety of shapes and sizes makes automation difficult especially for low volume production runs. Therefore, manual die attach is still used even though it involves costly human interaction and results in greater variation in device performance across a given production lot, reducing yield and increasing cost for devices of a given tolerance.

Another problem is that the high temperature necessary for the CuSil bonding of the spacer-to-flange can cause a slight warping of the spacer that can degrade the flange-to-spacer bond. The overall thickness of the spacer and leadframe is restricted to the upper surface of the die so as to accommodate wirebonding.

Another problem involves the preferred use of gold plating on the flange and lead frame to provide good electrical conductivity and good corrosion resistance to the connections in the packages such as the wire bonds. However, most amplifier manufacturers use tin-lead based solder for interconnecting the RF power transistor packages. Such solder can be metallurgically incompatible with gold. Therefore, connections to the gold plated leads has less than optimum reliability.

Finally, there is the intricate and hence expensive and time-consuming process of wire-bonding the die electrical contacts to the leadframe contacts. Clearly minimizing or eliminating such a process would be desirable.

In general, the above package fabrication techniques are holdovers from the earlier VDMOS and bipolar transistor packaging techniques. Due to the new LDMOS architecture, there is now an opportunity to further automate the LDMOS packaging process.

The instant invention results from an attempt to devise a simpler and more practical process to manufacture such heat-dissipating structures and packages for LDMOS transistors.

SUMMARY OF THE INVENTION

The principal and secondary objects of the invention are to provide a practical and automatable process to package LDMOS RF power transistors and to provide thermally efficient heatsink assembly and package components for use with this process while at the same time reducing or eliminating some of the problems identified above.

These and other objects are achieved by a novel package and process wherein die attachment to the flange occurs prior to leadframe/spacer attachment to the flange. A number of compatible combinations of flange and spacer materials, and their compatible bonding types are disclosed. A unique leadframe/spacer/flange heatsink assembly is also disclosed which automatically properly orients attachment of the leadframe/spacer to the flange, and provides for a thickened, less warpable spacer. A unique leadframe having contact projections also avoids later wire bonding. A unique leadframe/spacer/lid combination is disclosed which allows in one step the bonding of the leadframe to the flange, electrically contacting the die, and encapsulation.

DESCRIPTION OF THE PREFERRED EMBODIMENT OF THE INVENTION

The preferred embodiment of the claimed process will be described in connection with the fabrication of LDMOS power RF transistor heatsink assemblies and packages. The same process may be used in making other articles of manufacture requiring a semiconductor die be attached to a heatsink flange, wirebonded to a leadframe and encapsulated.

Figure 2:
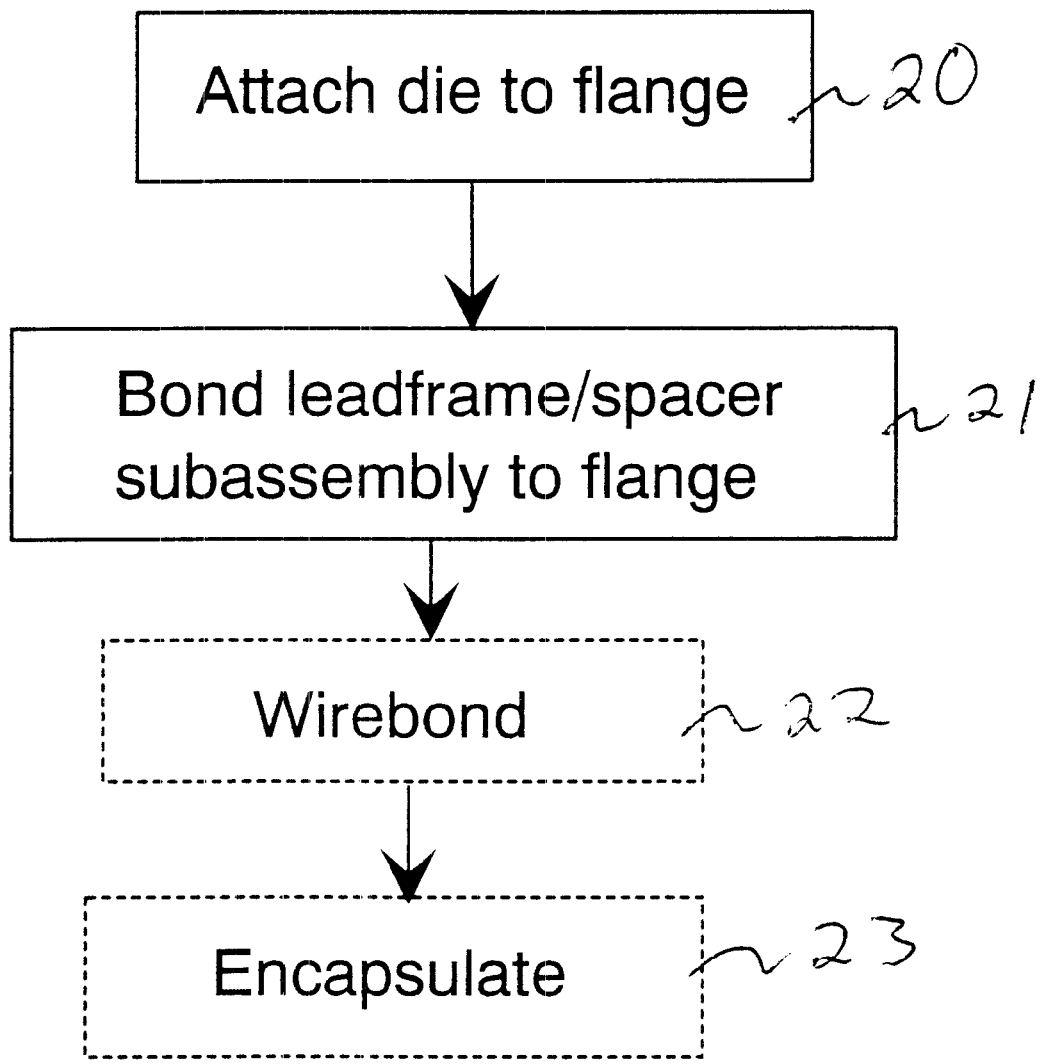
FIG. 2 is a flow chart diagram of the preferred general process steps of the invention.

Referring now to the drawing, there is shown in FIG. 2 the preferred process for packaging the transistor comprises first attaching 20 the die to the heatsink flange. Thereafter, the leadframe/spacer subassembly is bonded 21 to the flange. In a first embodiment wirebonding 22 and encapsulation 23 would follow. In other embodiments, electrical contact to the die occurs automatically upon leadframe attach, thereby eliminating the wirebonding step. In another embodiment, both wirebond and encapsulation are eliminated by attaching a leadframe/contact-arm/spacer/lid subassembly during spacer-to-flange bonding.

This reversed order of bonding allows for the use of existing automated die attach processes well known in the art. This in turn makes for more uniform device performance across a production lot. Also, it is no longer necessary to use high temperature bonding in the leadframe-to-spacer and spacer-to-flange bonds. Numerous bonding options are now available now to manufacturers depending desired device characteristics and tolerances, and the materials used to form the flange, the spacer and the leadframe. Also, these lower temperatures allow for the use of other spacer materials such as the "LTCC" family of ceramic insulators, or even the use of reinforced thermoplastic or thermosetting resin which can be injection molded to form the spacer separately or injection molded in the presence of the flange mounted die and wirebonded leadframe to encapsulate the same in one step.

Figure 1:
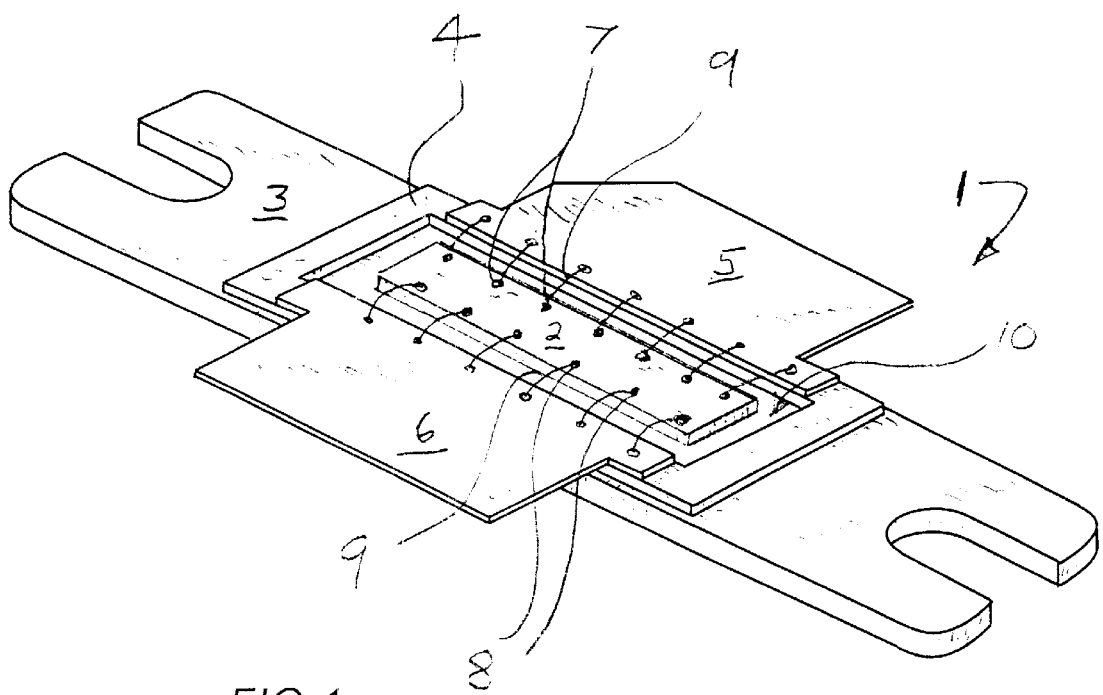
FIG. 1 is a perspective view of an LDMOS heatsink flange-spacer-leadframe assembly of the prior art.

Therefore, the above inventive method may be used create the prior LDMOS package of FIG. 1.

Figure 3:
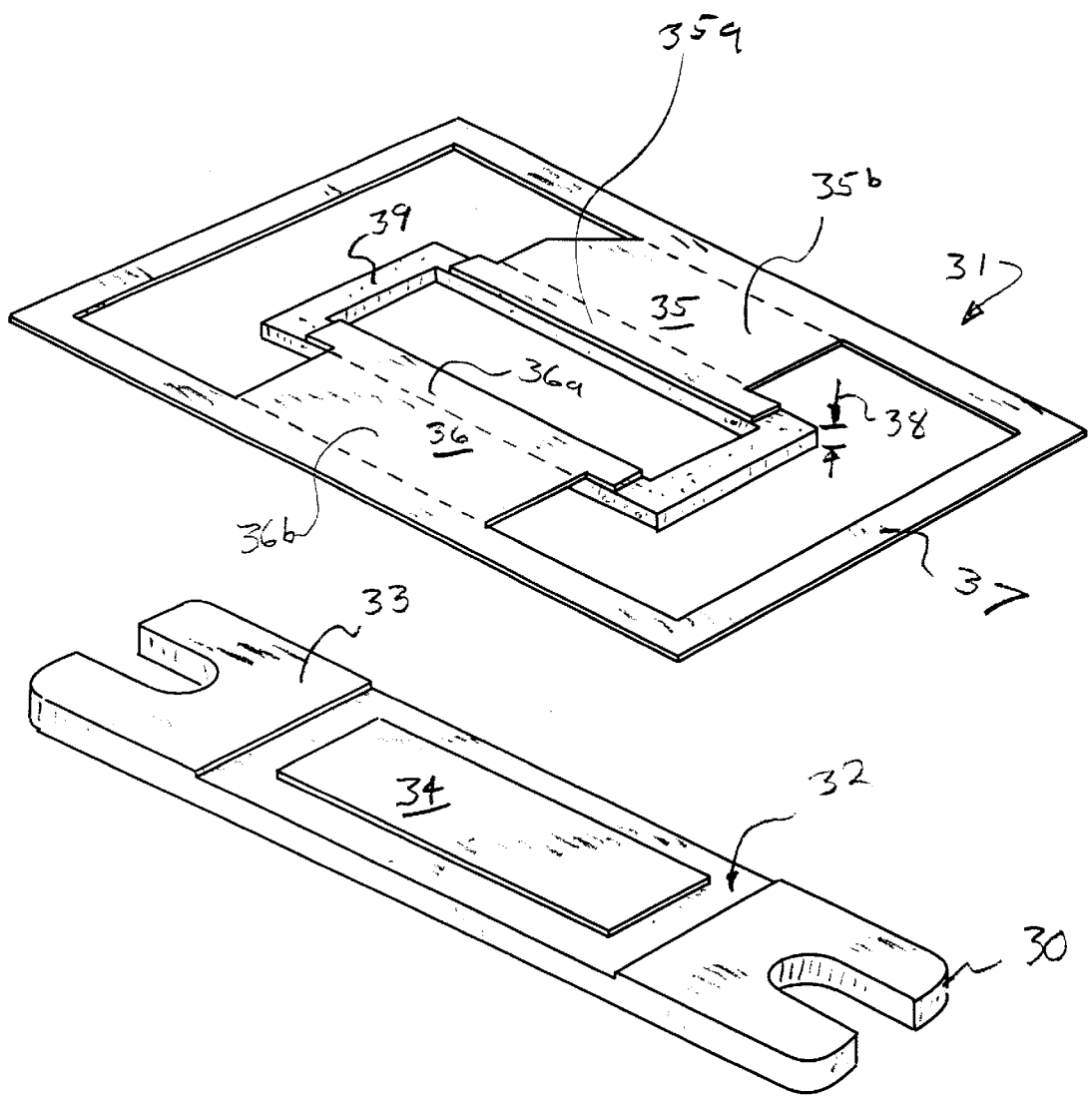
FIG. 3 is an exploded perspective view of a spacer-leadframe subassembly and a heatsink flange having the subassembly guiding moat feature of the invention.

Referring now to FIG. 3 there is shown a heatsink flange 30 and a pre-bonded leadframe/spacer subassembly 31 for use in the above fabrication process where die-to-flange attaching occurs prior to leadframe/spacer-to-flange bonding. The flange 30 is machined or otherwise formed to have a quadrangular moat 32 set into its substantially planar upper surface 33 thereby forming a substantially quadrangular raised pedestal or butte 34 having a substantially planar upper surface sized and shaped accept a die to be mounted thereon. The dimensions of the moat are selected to allow the spacer 39 nest therein. The leadframe comprises the gate 35 and drain 36 leads carried upon an integral quadrangular tie bar 37 which is removed after the leadframe-to-spacer bond or after the spacer-to-flange bond. The leadframe is bonded to the spacer using any of the bonding techniques disclosed in Table 1 below. The leads are then plated with a layer of gold which is thicker in the wire bond zones 35a,36a, preferably greater than about 50 mil to promote robust wirebond electrical contact, and thinner in the lead connect zones 35b,36b, preferably between about 10 and about 40 mil.

The thickness 38 of the spacer 39 is increased in proportion to the depth of the moat 32 so that the contact surface of the leads 35,36 is at the proper height in relation to the upper surface of the die for proper wirebonding.

Figure 4:
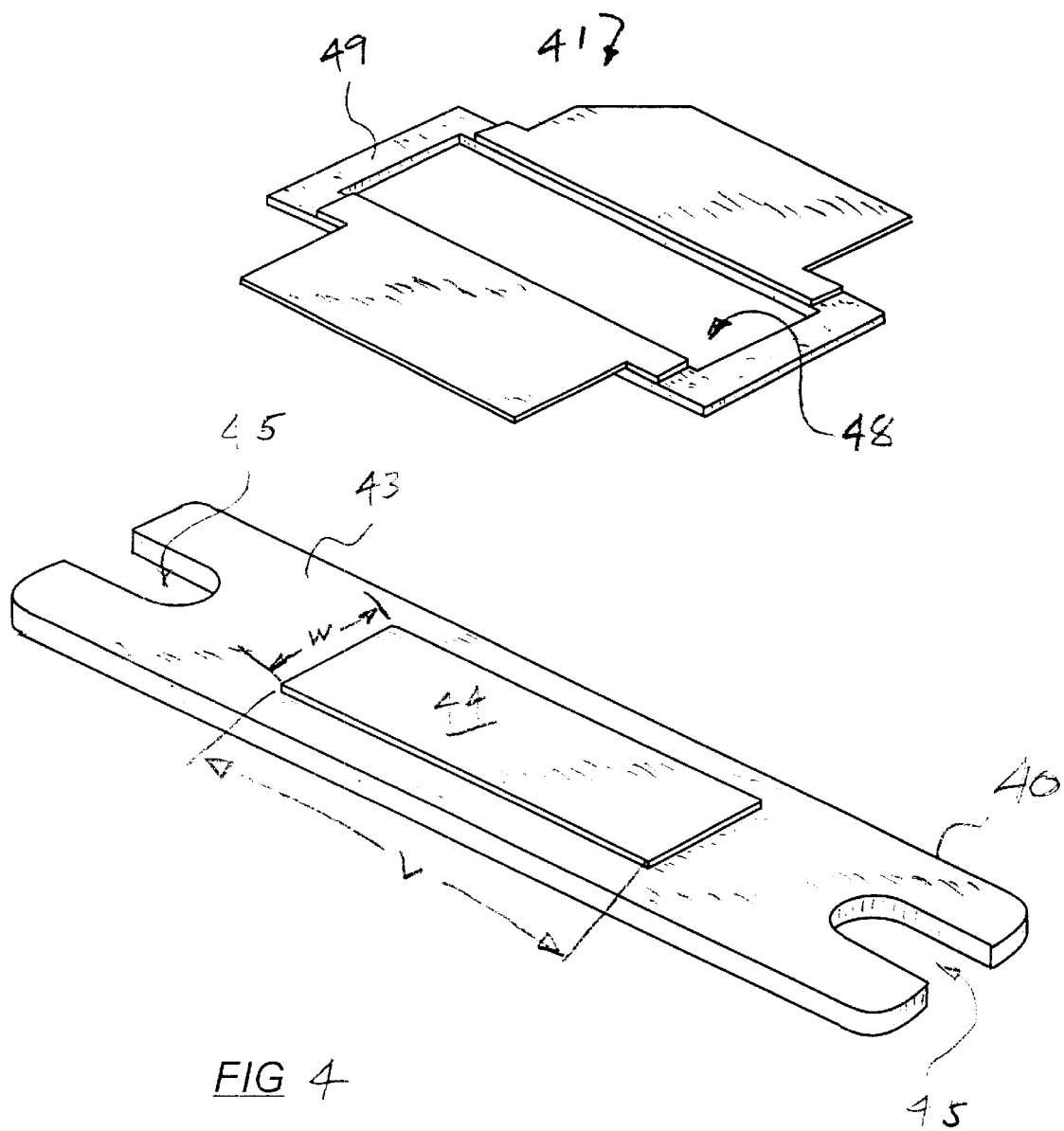
FIG. 4 is an exploded perspective view of a spacer-leadframe subassembly and a heatsink flange having the subassembly guiding butte feature of the invention.

In an alternate approach, the depth of the moat can be zero resulting in the unmachined flange of FIG. 4, or even negative, in which case the moat becomes a raised wall having a flat top surface. This structure would then surround a sunken well or trough in which is attached the die. The thickness of the spacer is then selected to provide proper vertical positioning between the leadframe and the die. Preferably therefore, the depth of the moat will range from about −0.01 inch to about +0.02 inch.

The flange and butte are made from heat-dissipating material. Also, the butte must have a CTE compatible with the die. Most preferably, the butte and flange are formed integrally using a powder metallurgical technique whereby high thermal conductivity powders are mixed and sintered to form a material having a die compatible CTE as described in Polese et al., U.S. Pat. No. 5,413,751 incorporated herein by this reference or through other well known powder metallurgical means. In this way, the flange including the butte are made from the same material. However, at somewhat greater expense, only a CTE compatible butte may be bonded to the flange as disclosed in Polese et al., U.S. Pat. No. 5,886,407 incorporated herein by this reference.

Preferred materials are high thermal conductivity, low thermal expansion materials which can withstand temperatures up to 400° C., which include tungsten-copper, molybdenum-copper, Copper-molybdenum-copper laminate, aluminum-silicon-carbide (known under the brand ALSIC), graphite-copper, and in non-CTE controlled applications, elemental copper and elemental aluminum.

The entire outer surface of the flange is then plated with a layer of gold or other electrically conductive material using methods well-known to the art.

Figure 9:
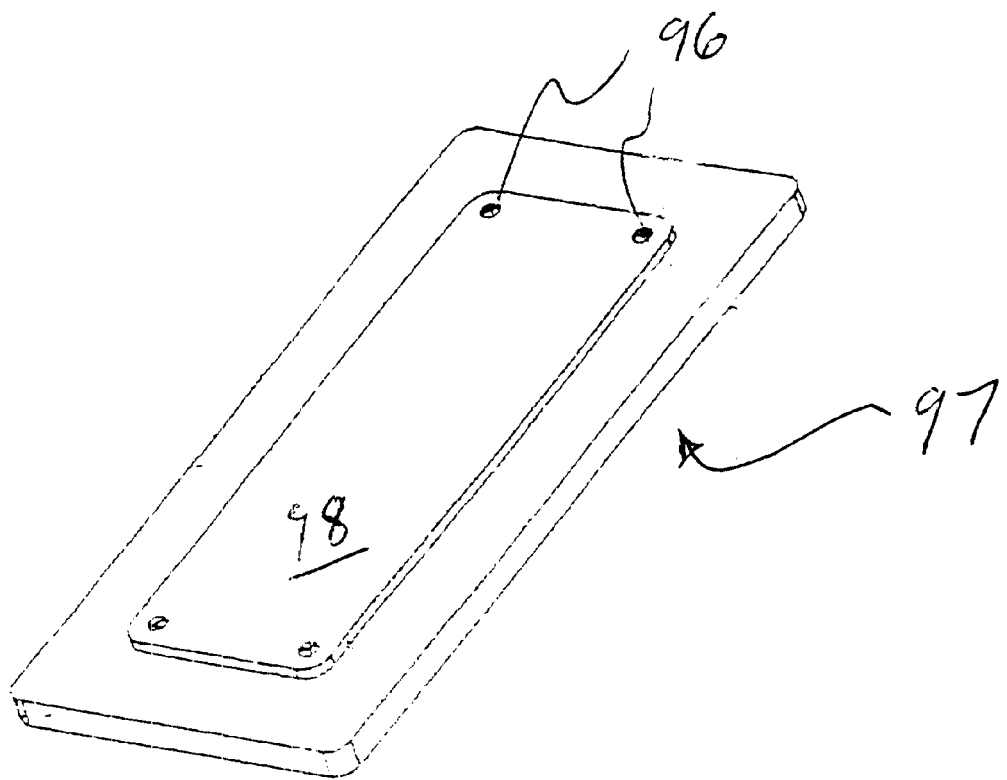
FIG. 9 is a perspective view of a heatsink flange without mounting notches and with targeting fiducials.

The die is then precisely placed onto the butte using automated "pick-and-place" equipment well known to the art which is capable of placing and attaching the die in one step. Precision alignment of the die allows for automatic alignment of the spacer upon the flange and around the die. Alternately, or in addition, as shown in FIG. 9, targetting fiducials 96 can be located at various positions on the outer surface of the heatsink flange 97 to further assist alignment. These positions can include locations on the upper surface of the raised butte 98. Both wirebonding and encapsulation may then follow.

An alternate embodiment as shown in FIG. 4 shows the leadframe/spacer sub-assembly 41 after tie bar removal. The heatsink flange 40 has a substantially planar upper surface 43 from which extends a substantially quadrangular raised butte 44 sized and shaped similarly to the previous embodiment so that the lateral dimensions such as length L and width W of the butte are selected to nest within the cavity 48 formed in the dielectric spacer 49 and thereby allow for precise placement of the spacer on the flange. Again, both wirebonding and encapsulation may then follow.

Alternately, a target or fiducial in the form of a pit or stain or other markings known in the art may be placed on the flange during fabrication to assist in precise placement of the die and/or spacer onto the flange. Even the flange mounting notches 45 may be used as a locating target or fiducial. If such a fiducial is used, the raised butte may be eliminated without departure from the invention.

Figure 5:
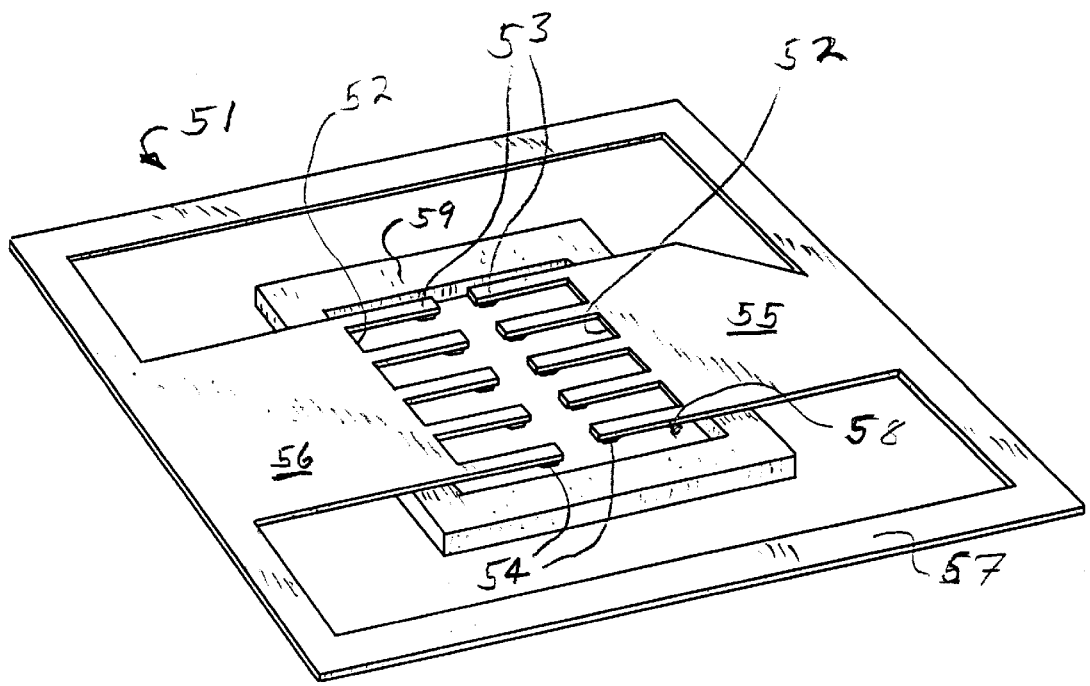
FIG. 5 is a perspective view of a leadframe including the die contacting contact arms feature of the invention.
Figure 6:
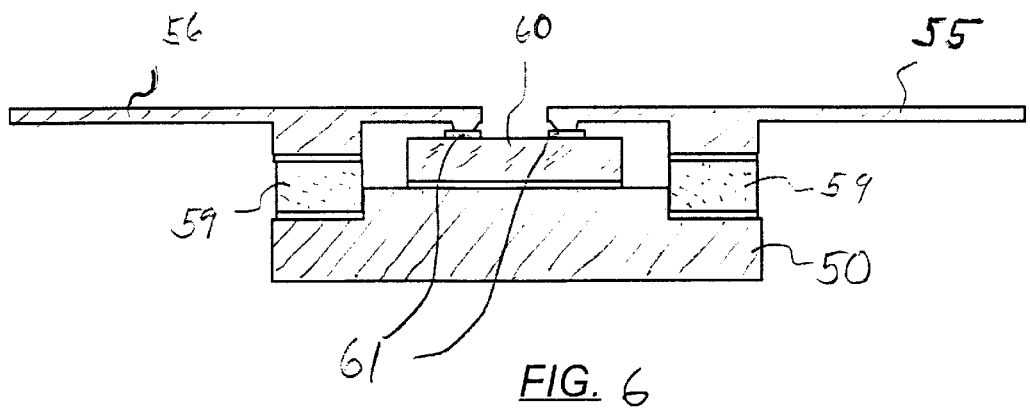
FIG. 6 is a cross-sectional side view of the leadframe/spacer subassembly after bonding to the flange including the contact arms feature of the invention.

Another alternate embodiment shown in FIGS. 5 and 6 allows for avoiding later wirebonding of the die to the leadframe. The leadframe/spacer subassembly 51 comprises two generally quadrangular leads 55,56 which have been prebonded to the spacer 59 using one of the bonding techniques described Table 1. The lead tie bar 57 allows for single precise placement of the leadframe onto the spacer. The spacer has a generally quadrangular body having a central cavity 58. As with the previous embodiment, the cavity is shaped and sized to fit over the top of the die 60 as attached to the flange 50. Extending inward from the inner edges 52 of each lead are a plurality of contact projections or arms 53 made from electrically conductive material, preferably of the same material as the frame and formed integrally therewith. The arms are shaped and located to obviate the need for later wirebonding by extending out over the cavity to contact the contact pads 61 on the upper facing surface of the LDMOS die. Optionally, each arm may have a downwardly projecting nib 54 at its extremity to facilitate contacting the pads without contacting other portions of the die.

As a result, electrical contact between the leadframe and die can occur automatically during the leadframe/spacer-to-flange bonding, eliminating the need for later wirebonding. Further, contact arms are structurally hardier than the typically thin wire bonds of the prior art.

Figure 7:
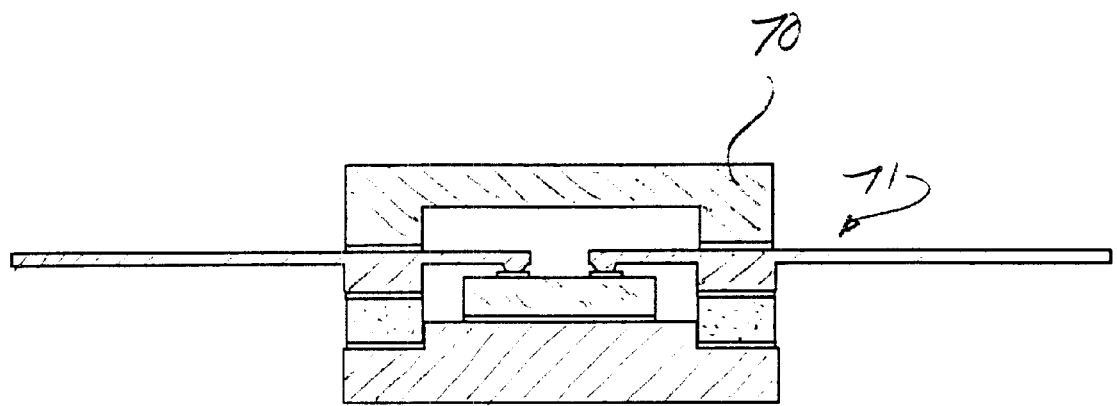
FIG. 7 is a cross-sectional side view of the leadframe/spacer/encapsulation lid subassembly after bonding to the flange including the contact arms feature of the invention.

In an alternate embodiment, as shown in FIG. 7, an electrically insulating lid 70 is prebonded to the leadframe/spacer subassembly 71 prior to the leadframe/spacer-to-flange bond. This allows in one step the bonding of the leadframe to the flange, electrically contacting the die, and encapsulation.

Example 1

Figure 8:
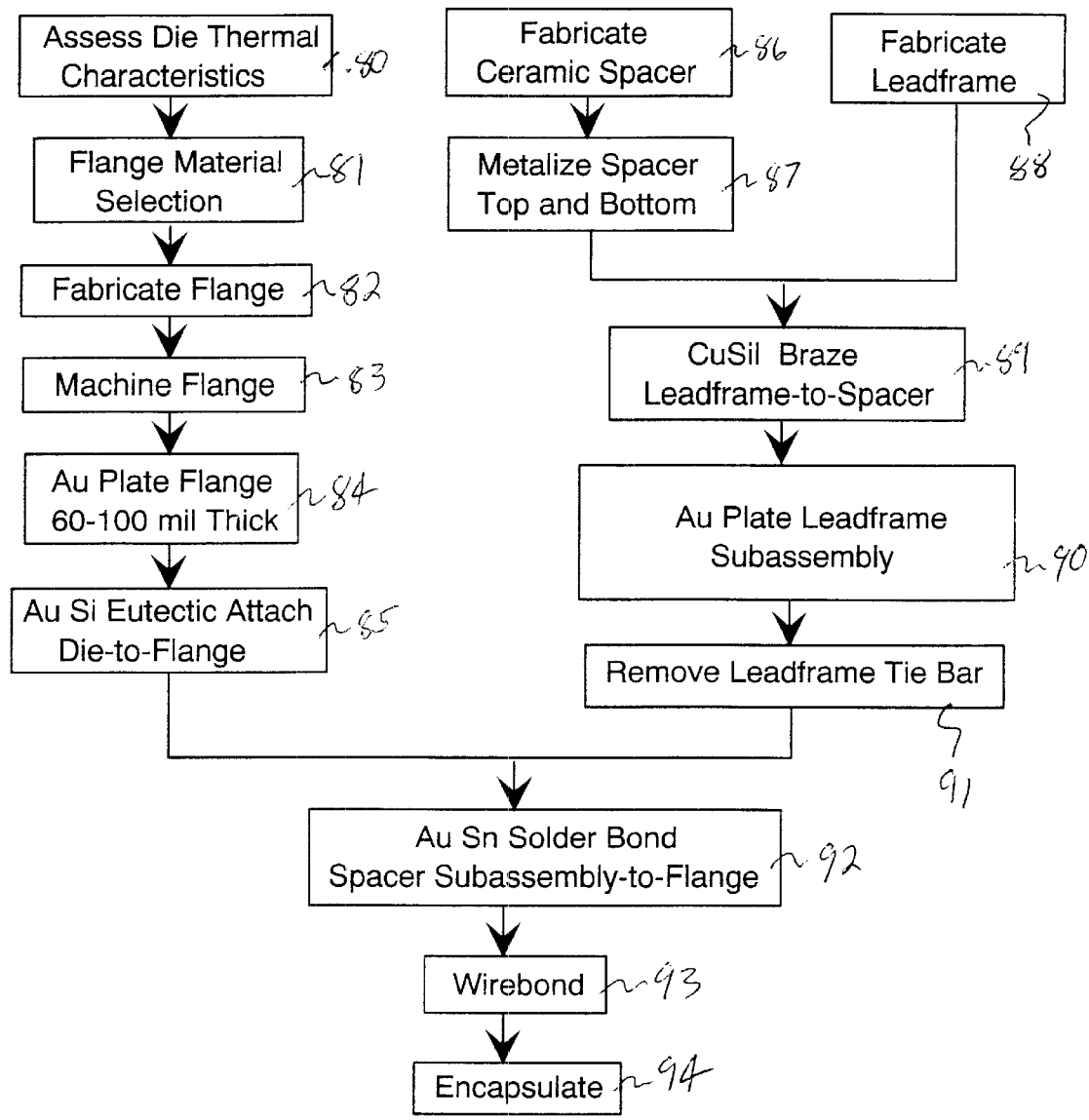
FIG. 8 is a flow chart diagram of the preferred process steps of an example of the invention.

Referring now to FIG. 8, there is shown a flow chart diagram of process steps in an example of the preferred embodiment of the invention.

First the thermal characteristics of the die are assessed 80 including expected heat output and its CTE. The flange material is then selected 81. For a sintered powder metal composite, the type and concentrations of the component powders are selected to maximize thermal conductivity while maintaining a compatible CTE and overall cost.

The flange is then fabricated 82 by sintering a mixture of tungsten and copper powders having a concentration of about 15 to 25 weight percent copper to form a composite which ranges from about 0.7 to 2.0 inches long, about 0.2 to 0.5 inches wide and about 0.035 to 0.09 inches thick.

The flange is then machined 83 to form the moat/butte feature as in FIG. 3. The moat is approximately 0.005 to about 0.020 inch deep. The flange is then fully plated 84 with gold to a thickness of at least about 100 microinches using electrolytic type plating. The die is attached to the flange using a silicon-gold eutectic brazing 85.

Separately, an about 88 to 99 percent ceramic alumina spacer is formed 86 by dry press, tape casting or laser machining and has dimensions of about 0.3 to 1.5 inches long, about 0.2 to 0.5 inches wide, and about 0.02 to 0.05 inches thick. The top and bottom surfaces of the spacer is then metalized 87 using a refractory metal-glass matrix which is then plated with nickel and/or gold. Note that metalization may not be required for some of the adhesive bonding types.

Separately, the leadframe comprising the gate and drain leads carried on a tie bar is formed 88 from an Fe—Ni alloy such as FeNi Alloy 42 having 42 weight percent nickel, or KOVAR brand material having 29 weight percent nickel, 17 weight cobalt and the balance iron, using methods well known in the art such as stamping.

The leadframe is then bonded 89 to the top surface of the spacer to form the leadframe/spacer subassembly using Cu—Ag alloy brazing or any of the soldering types listed in Table 1 which are compatible with the plating and spacer-to-flange processes performed afterward.

The leadframe/spacer subassembly is then plated with gold to a thickness of between about 30 and 50 microinches using electrolytic plating to plate all exposed metallized surfaces. Alternately, both the gate and drain leads can be selectively plated 90 with gold in the lead contact zone to a thickness of about 10 to 40 microinches and in the wirebond zone to a thickness of about 50 to 200 microinches using conventional electroplating methods so that the ends of the leads in the contact zone can accept common Sn—Pb soldering. The tie bar is then removed 91.

Thereafter, the leadframe/spacer subassembly is then bonded 92 to the flange using either brazing, solder or adhesive bonding as disclosed in Table 1 below. All of these techniques allow for bonding to occur at a temperature between 150 and 400° C. Wirebonding 93 and encapsulation 94 then follow using methods well known in the art.

Table 1 shows the types of bonding techniques and materials available for the flange-to-spacer and spacer-to-leadframe bonds where the LDMOS device is made from silicon and the spacer is ceramic:

TABLE 1

Ceramic-to-Metal Bonding Types

| Bond Type | Temperature Tolerance |
| --- | --- |
| Lead-free solder alloys: (Preferred for lower toxicity) | |
| 80% Au 20% Sn | to 280° C. |
| 90% Sn 10% Ag | to 275° C. |
| 97% Sn 3% Cu | to 300° C. |
| 92% Sn 8% Sb | to 250° C. |
| Leaded solder alloys: | |
| 97.5% Pb 1.5% Ag 1% Sn | to 309° C. |
| 95% Pb 5% In | to 313° C. |
| Certain Other Known Alloys Containing: | |
| Au, Ag, In, Ge, Pb, Sb or Sn | to 400° C. |
| Organic adhesives: | |
| Thermal Epoxies: | |
| Ag filled | to 200° C. |
| Boron Nitride ceramic filled | to 200° C. |
| Certain Other Known Epoxies: | to approx. 200° C. |

Is shall be apparent to those skilled in the art the above invention may be easily adapted to heatsink assemblies designed to carry two or more LDMOS transistors or other semiconductor dies, and to other multi-chip modules in general.

In this specification chemical element symbols are used to signify elements as is most generally accepted in the art.

While the preferred embodiment of the invention has been described, modifications can be made and other embodiments may be devised without departing from the spirit of the invention and the scope of the appended claims.

What is claimed is:

1. A heat-dissipating package for carrying a semiconductor die comprises:

a flange having an upper surface for mounting said die; and a spacer made from dielectric material;

wherein said flange has a mechanical targeting feature for facilitating precise placement of said spacer upon said flange;

wherein said feature comprises a butte supporting said upper surface, wherein said butte is sized and shaped to bear against corresponding surfaces of said spacer; and wherein said feature further comprises a moat surrounding said butte.

2. The package of claim 1, wherein said butte comprises a targeting fiducial formed on an upper surface of said butte.

3. The package of claim 1, which further comprises a leadframe having die-contacting arms.

4. The package of claim 1, which further comprises a leadframe bonded to said spacer.

5. The package of claims 4, which further comprises a lid bonded to said leadframe.

6. A heat-dissipating package for carrying a semiconductor die comprises:

a flange having an upper surface for mounting said die; and a spacer made from dielectric material;

wherein said flange has a mechanical targeting feature for facilitating precise placement of said spacer upon said flange;

wherein said feature comprises a butte supporting said upper surface, wherein said butte is sized and shaped to bear against corresponding surfaces of said spacer; and wherein said butte comprises a targeting fiducial formed on an upper surface of said butte.

7. The package of claim 6, which further comprises a leadframe having die-contacting arms.

8. The package of claim 6, which further comprises a leadframe bonded to said spacer.

9. The package of claim 8, which further comprises a lid bonded to said leadframe.

* * * * *